United States Patent [19]

Suzuki

[11] Patent Number: 4,575,250
[45] Date of Patent: Mar. 11, 1986

[54] ALIGNING APPARATUS AND METHOD FOR MITIGATING INSTABILITY CAUSED BY INTERFERENCE IN ALIGNMENT SIGNAL

[75] Inventor: Akiyoshi Suzuki, Tokyo, Japan
[73] Assignee: Canon Kabushiki Kaisha, Tokyo, Japan
[21] Appl. No.: 451,334
[22] Filed: Dec. 20, 1982
[30] Foreign Application Priority Data
Dec. 29, 1981 [JP] Japan ................. 56-215324
[51] Int. Cl.⁴ ................................ G01B 11/26
[52] U.S. Cl. ..................... 356/401; 250/548; 250/557
[58] Field of Search ............... 356/399, 400, 401, 375; 250/548, 557; 355/53

[56] References Cited

U.S. PATENT DOCUMENTS 4,367,046 1/1983 Lacombat .................. 356/400

Primary Examiner—F. L. Evans
Attorney, Agent, or Firm—Fitzpatrick, Cella, Harper & Scinto

[57] ABSTRACT

An aligning apparatus and method aligns a mask and a wafer stably at their regular positions in spite of the presence of the disturbance of alignment signals by the light interference effect when the printing of a semiconductor circuit pattern is effected with the mask and wafer in proximity to each other and further when the printing is effected with the mask pattern projected to the wafer.

13 Claims, 13 Drawing Figures

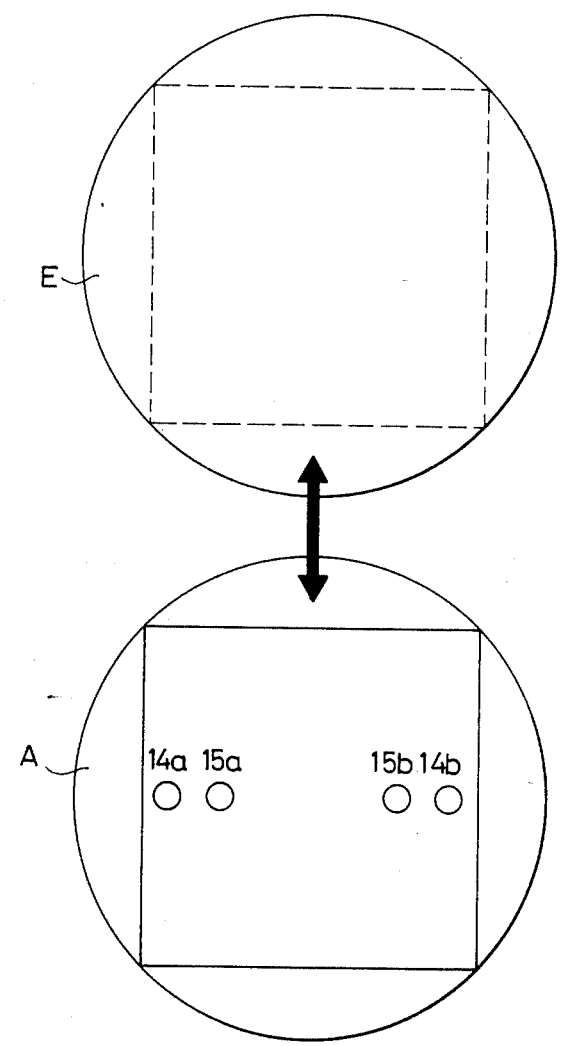

ALIGNING APPARATUS AND METHOD FOR MITIGATING INSTABILITY CAUSED BY INTERFERENCE IN ALIGNMENT SIGNAL

BACKGROUND OF THE INVENTION

1. Field of the Invention

This invention relates to an aligning apparatus and method, and more particularly to an apparatus such as a semiconductor circuit pattern exposure apparatus (a so-called mask aligner) which effects precise alignment.

2. Description of the Prior Art

Generally, semiconductor elements, IC, etc. are manufactured by repeating the steps of printing a complicated circuit pattern on a substrate of Si, GaAs or the like and applying a chemical or physical treatment thereto.

In this case, there arises the necessity of accurately aligning the pattern for the next step with the predetermined position of the substrate subjected to the preceding step of processing.

In recent years, making the patterns minute has been pursued to provide a higher production speed and higher integration and alignment accuracy as high as the order of 0.1 μm has been required.

Heretofore, such alignment has been carried out by the operator through his visual observation, but in recent years, attention has become directed to automation of such work, namely, autoalignment. For example, the scanning type light detecting apparatus described in U.S. Pat. No. 4,165,149 assigned to the same assignee as the assignee of the present invention in such that a laser light is imaged in the form of a spot or a slit on a body and scans the body at a uniform speed, whereby the scattered light from a mark provided for alignment is detected. By the advent of the laser light scanning method, it has become possible to extract a signal of good S/N ratio even from a semiconductor wafer on which a circuit pattern has been printed and which has a complicated minute cross-sectional shape and thus, the autoalignment technique has rapidly become popular.

The laser light scanning system, as seen, for example, in the photoelectric detecting apparatus of U.S. Pat. No. 4,251,129 assigned to the same assignee as the assignee of the present invention, is applicable not only to the contact method in which the spacing between a mask and a wafer is zero or the proximity method in which the spacing between the mask and the wafer is slight, but also to the projection method using a lens or a mirror.

Now, as a factor for improving the accuracy of autoalignment in the field concerned, solution of the problem of interference of laser light has become a great task. That is, the edge signal output of the alignment mark of the mask fluctuates and stable alignment is difficult to achieve. This is shown in FIG. 1 of the accompanying drawings. In FIG. 1, reference numeral 1 designates a mask formed with a pattern to be printed, reference numeral 2 denotes a wafer, and reference numeral 3 designates an incident light. There are two kinds of light scattered by the edge of the alignment mark of the mask 1.

One is the light directly scattered and returning from the edge of the alignment mark, as indicated by 4 in FIG. 1, and the other is the light reflected by and returning from the wafer 2. There are two kinds of light reflected by and returning from the wafer 2. One is the light scattered by the edge of the alignment mark of the mask 1 and reflected by the wafer 2, as indicated by 5, and the other is the light passing the edge of the alignment mark of the mask 1, reflected by the wafer 2 and thereafter scattered by the edge of the alignment mark, as indicated by 6. The wafer usually has a high reflection factor and therefore, the interference between the light 4 directly scattered from the edge of the alignment mark of the mask 1 and the light 5 or 6 reflected by the wafer 2 becomes great and, during alignment, due to a minute change between the mask and the wafer, the alignment signal output of the photomask fluctuates markedly and becomes unstable. This effect has adversely affected the alignment accuracy.

In the foregoing, it has been described that the edge signal output of the alignment mark of the mask 1 becomes unstable by the interference resulting from the presence of the wafer 2, and besides this, it is theoretically conceivable that the edge signal output of the alignment mark of the wafer 2 becomes unstable by the interference resulting from the presence of the mask.

That is, the light directly scattered from the edge of the alignment mark of the wafer and the light reflected by the underside of the mask, again returning to the wafer and scattered from the edge of the alignment mark of the wafer interfere with each other.

However, since the mask is usually formed of a material such as glass which has a low reflection factor, the interference thereof is weak actually and thus, the edge signal output of the alignment mark of the wafer is stable.

The influence of the interference on the edge signal output of the alignment mark of the mask is remarkable in proximity printing wherein the gap between the mask and the wafer is slight, but this is still a problem again in the case of the projection printing using a lens or mirror optical system because the interference distance of laser light is long.

SUMMARY OF THE INVENTION

It is an object of the present invention to eliminate the instability resulting from such interference phenomenon of the alignment signal from the edge of the alignment mark on the mask and to provide a novel aligning apparatus and method which enable stable measurement and alignment of higher accuracy to be accomplished.

This object is achieved by providing a second alignment mark at an area whereat one body does not substantially exist and further by providing such second alignment mark on the other body.

Thus, a stable output from the second alignment mark is obtained and with this output used as a reference signal, as a first stage, the relative positional relation with the first alignment mark of the mask is detected in a condition in which the wafer does not substantially exist, and as a second stage, the relative positional relation with the alignment mark of the wafer opposed to the first alignment mark of the mask is detected in a condition in which the wafer substantially exists, whereby alignment of the mask and the wafer can be accomplished stably.

If the second alignment mark is provided on the mask, the relative positional relation between the first alignment mark and the second alignment mark on the mask is maintained and therefore, even if the absolute position of the mask should change, the second alignment mark may be used as the reference and the position of the first alignment mark relative thereto does not change, whereby stable alignment of the mask and the wafer can be accomplished.

In the present invention, the first alignment mark and the second alignment mark are observed through discrete objective lens systems, and where the second alignment mark is provided on the mask, the point of focus can be independently made coincident with the mask on the one hand and with the wafer on the other hand and thus, any error resulting from focus deviation can be eliminated.

The invention will become more fully apparent from the following detailed description thereof taken in conjunction with the accompanying drawings.

BRIEF DESCRIPTION OF THE DRAWINGS

FIG. 13 illustrates a system in which the alignment position and the exposure position are separate from each other.

DETAILED DESCRIPTION OF THE PREFERRED EMBODIMENTS

Figure 2:
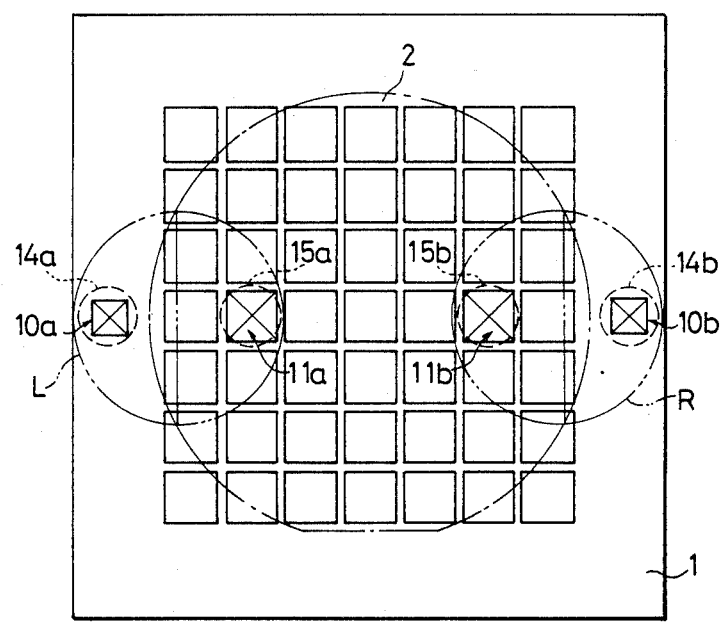
FIG. 2 shows the position of the alignment marks on the mask of the present invention relative to a wafer.

FIG. 2 shows a preferred embodiment of the present invention.

In FIG. 2, reference numeral 1 designates a mask and reference numeral 2 indicated by a dot-and-dash line designates a wafer.

On the mask 1, there are formed alignment marks 10a, 11a, 10b and 11b in addition to a circuit pattern (an actual element pattern). The marks 10a and 11a are field-synthesized as a left view field system through objective lenses 14a and 15a, respectively, and the marks 10b and 11b are field-synthesized as a right view field system through objective lenses 14b and 15b, respectively. The alignment marks 11a and 11b are the heretofore used marks, and it is a characteristic of the present invention that the alignment marks 10a and 10b are newly provided in addition to the alignment marks 11a and 11b.

It should be noted here that the wafer 2 does not exist below the marks designated by 10a and 10b. Although not possible in the contact proximity method, in the case of the projection method, even if the wafer 2 exists, the reflected light from the wafer 2 can be minimized by a shutter or the like and at least when certain areas of the marks 10a and 10b are to be aligned, it is also possible to form a condition in which the wafer 2 does not substantially exist.

Thus, during alignment, the wafer 2 does not substantially exist below the marks designated by 10a and 10b and therefore, the reflected light 5 or 6 from the wafer in FIG. 1 does not exist but only the scattered light 4 exists. Because the reflected light 5 or 6 from the wafer 2 does not exist, no interference occurs and a very stable mask signal can be extracted.

The marks 10a and 10b provided at positions which do not overlap with this wafer area are used as the standard of the alignment of the mask and wafer.

It is desirable that the portions below the marks 10a and 10b be subjected to the step of substantially preventing them from reflecting light. For example, an aperture can be formed at a portion corresponding to a photomask holder so that the light passed through the photomask may escape to the outside through this aperture and may not return to the observation system. Instead of forming such aperture, anti-reflection treatment may be applied to the portions corresponding to the marks 10a and 10b. Where some treatment is applied to the photomask holder, the places at which the marks 10a and 10b, which are the characteristic of the present invention, are provided are naturally limited, but there are other places than the effective area of the wafer and no problem occurs in practice.

Figure 3:
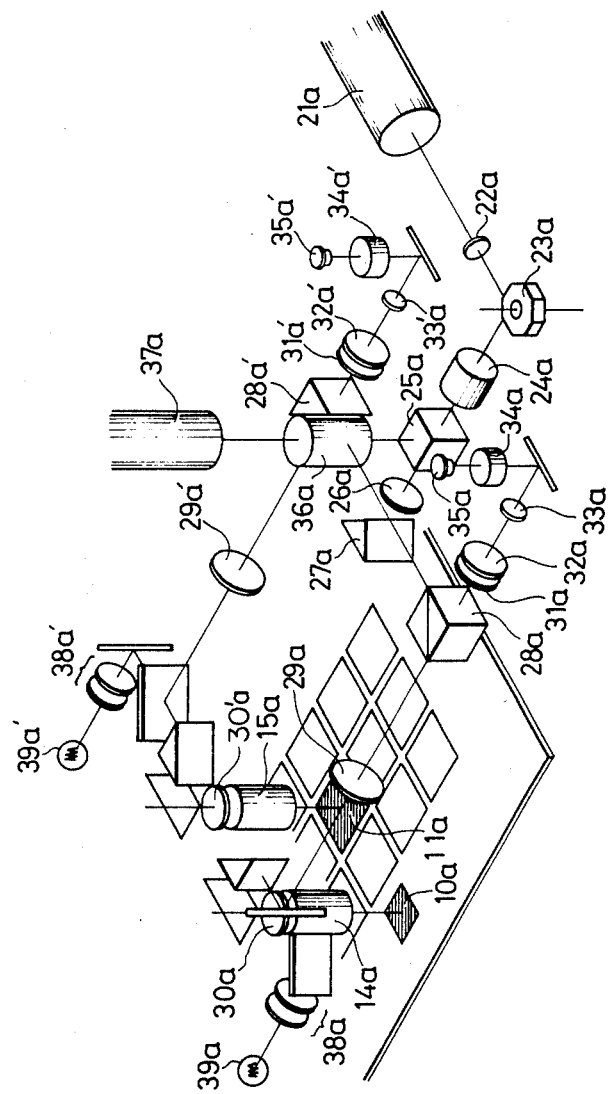
FIG. 3 is a perspective view showing the left half of an alignment scope system in the present invention.

It has already been described that the signals from the marks 10a and 10b are stably extracted irrespective of the presence of the wafer, but if a laser light is scanned as a first stage of alignment in a condition in which the wafer does not substantially exist, the edge signals not only from the patterns 10a and 10b but also from the marks 11a and 11b are stably obtained and the positions of the marks 11a and 11b are stably detected and measured relative to the positions of the marks 10a and 10b. As a second stage of alignment which will hereinafter be described, in a condition in which the wafer substantially exists, the positions of the alignment marks on the wafer are detected and measured relative to the positions of the marks 10a and 10b on the mask. In FIG. 3, there is shown an alignment scope system for observing the surface of the mask therethrough. In FIG. 3, only one side view field, i.e., only the left-hand area L in FIG. 2, is shown.

The system of FIG. 3 includes objective lenses 14a, 15a, a laser 21a, a lens 22a for imaging the laser as a spot, a rotational polygonal mirror 23a, and f-θ lens 24a, a beam splitter 25a for the observation system, a field lens 26a, a view field dividing prism 27a, polarizing beam splitters 28a, 28'a, relay lenses 29a, 29'a, ¼ wavelength plates 30a, 30'a, laser light transmitting filters 31a, 31'a, pupil imaging lenses 32a, 32'a, spatial frequency filters (stoppers) 33a, 33'a for eliminating 0-order light, condenser lenses 34a, 34'a and photodetectors 35a, 35'a. These constitute a photoelectric detecting system. Reference character 36a designates an erector lens, reference character 37a denotes an image pickup element, reference characters 38a and 38'a designate view field illuminating systems, and reference characters 39a and 39'a denote illuminating light sources.

As regards the construction of the alignment scope system, various modifications are conceivable such as using optical fibers for the illuminating light sources 39a and 39'a, or changing the manner of bending the optical path, but here, FIG. 3 is shown as a typical example.

It is in connection with the polarizing beam splitters 28a and 28'a that, in FIG. 3, the ¼ wavelength plates 30a and 30'a are provided on the objective lenses 14a and 15a.

That is, the scanned laser light reflected by the polarizing beam splitters 28a and 28'a and entering the objective lenses 14a and 15a passes through the ¼ wavelength plates 30a and 30'a, is reflected by the mask or the wafer and again passes through the ¼ wavelength plates 30a and 30'a, whereby the direction of polarization is rotated by 90°, and said light again enters the polarizing beam splitters 28a and 28'a and now passes therethrough to the photodetectors 35a and 35'a.

By using such polarizing means, scanning signal detection is accomplished efficiently with a very small loss of quantity of light.

The mask 1 and wafer 2 arranged as shown in FIG. 2 are observed by the use of the optical system as shown in FIG. 3, and as shown in FIG. 2, the objective lenses 14a and 15a and the objective lenses 14b and 15b constructed symmetrically therewith form a pair. The alignment marks observed through such an alignment scope system will now be described.

Figure 4:
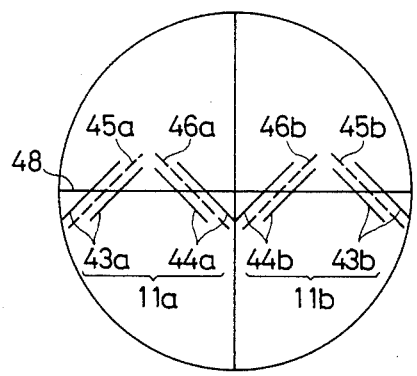
FIG. 4 shows the entire alignment marks on the mask and wafer according to the prior art.

FIG. 4 shows conventional alignment marks.

Designated by 43a, 44a, 43b and 44b are the alignment marks of the mask, and denoted by 45a, 46a, 45b and 46b are the alignment marks of the wafer.

FIG. 4 is an example of the image observed by the use of a conventional system and shows the system in case the marks are field-synthesized through the two objective lenses 15a and 15b. That is, the marks 43a, 44a, 45a and 46a are field-synthesized on the display surface through one objective lens 15a, and the marks 43b, 44b, 45b and 46b are field-synthesized on the display surface through the other objective lens 15b. The two lines of the alignment mark 43a on the mask are parallel to each other and are set so as to be orthogonal to the alignment mark 44a which also comprises two parallel lines.

Also, the alignment marks 45a and 46a on the wafer are set so as to be orthogonal to each other. The marks 43b, 44b, 45b and 46b also are in a similar relation.

Designated by 48 is the scanning line of the laser scanning beam. By the beam being scanned, the scanning signal outputs from the edge portions of the alignment marks of the mask and wafer are obtained time-serially. Since the scanning speed of the laser beam is made constant by the f-θ lens, the edge spacing of the alignment marks can be detected from the time interval between the time-serial signal outputs, and the mask and wafer are moved relative to each other by a minute amount so that said edge spacing may assume a predetermined value, thereby completing the alignment. Heretofore, alignment of a mask and a wafer has been effected in a condition in which the wafer exists and therefore, as already described, the edge signal outputs from the alignment marks 43a, 44a, 43b and 44b of the mask have been caused to fluctuate by interference action and stable alignment operation has been difficult.

Figure 5:
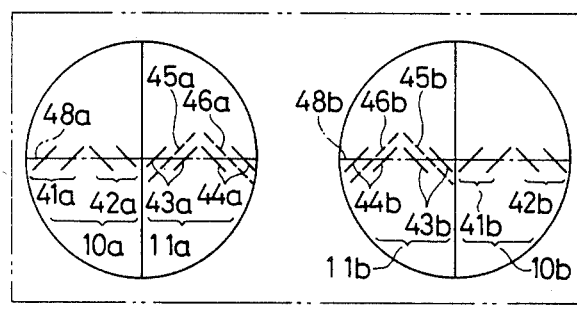
FIG. 5 shows an embodiment of the alignment marks on the mask and wafer of the present invention.

FIG. 5 illustrates the entire system field-synthesized by the use of the alignment marks of the present invention.

By the objective lenses 14a and 15a, the marks 10a and 11a are projected upon the view field dividing prism 27a while being distributed with respect to the edge thereof, whereafter they are projected as the same display surface upon the image pick-up element 37a by the erector lens 36a so that they are field-synthesized. Likewise, by the objective lenses 14b and 15b provided at positions symmetric with respect to the center of the mask, the marks 10b and 11b are projected upon the image pick-up element 37b so that they are field-synthesized.

It is of course possible to re-synthesize the outputs from the image pick-up elements 37a and 37b and display them on the same display surface.

It should be noted here that, of the alignment marks 41a, 42a, 43a, 44a, 41b, 42b, 43b and 44b provided on the mask, the alignment marks 41a, 42a, 41b and 42b, namely, 10a and 10b, are provided outside the wafer area as viewed from the direction of the optical axis of the objective lens.

Figure 6:
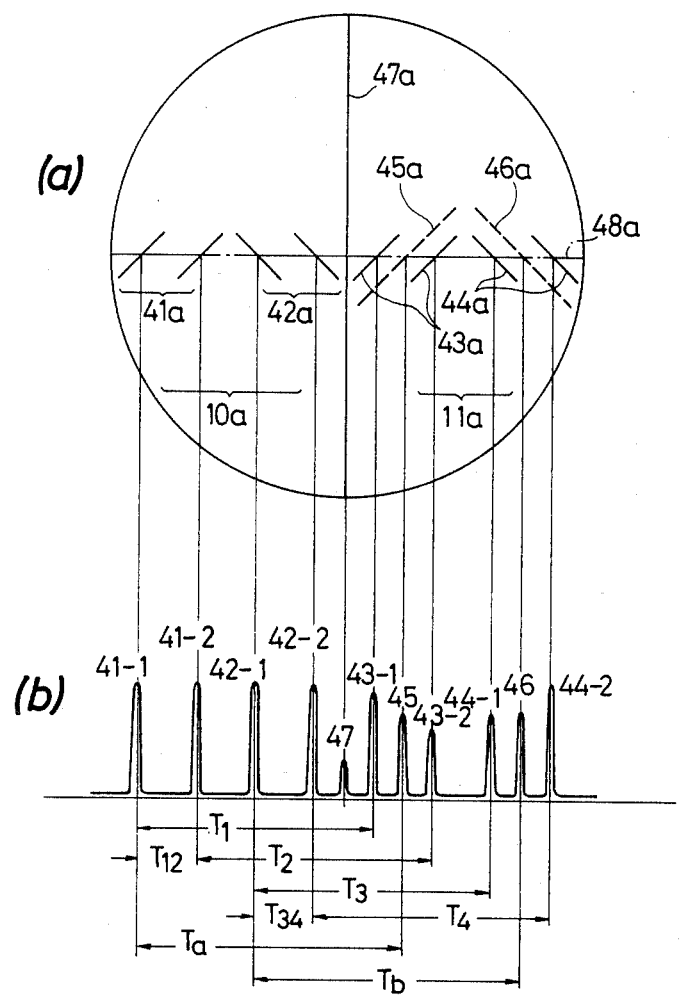
FIG. 6 shows the images observed through the alignment scope shown in FIG. 3 and the outputs from the observed images.

The marks 10a and 11a in the left view field of FIG. 5 will hereinafter be described in detail by reference to FIG. 6. The marks 10b and 11b in the right view field of FIG. 5 need not be described because they can be handled similarly from the symmetry thereof.

In FIG. 6(a), the mark 41a on the mask is parallel to the mark 43a, the mark 42a is parallel to the mark 44a, and the mark 43a is orthogonal to the mark 44a.

Heretofore, the marks 45a and 46a on the wafer have been aligned relative to the marks 43a and 44a on the mask, whereas in the present invention, the marks 45a and 46a on the wafer are aligned relative to the marks 41a and 42a on the mask.

As the premise for this, it is necessary that the positional relation of the marks 43a and 44a on the mask be specified relative to the marks 41a and 42a on the mask. Thus, as a first stage, detection is effected stably in a condition in which the wafer does not substantially exist. When, as a second stage, the marks are scanned by a scanning beam 48a in a condition in which the wafer substantially exists, the time-serial outputs from the edge signals of the marks of the mask and wafer by the photodetectors 35a and 35'a are obtained as shown in FIG. 6(b).

Figure 1:
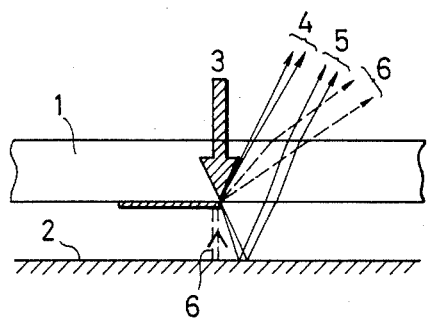
FIG. 1 illustrates the influence of interference on the alignment mark signal on a mask.

In FIG. 6(b), 41-1 designates the output from the left line of the mark 41a, and 41-2 designates the output from the right line of the mark 41a, and the other suffixes also apply correspondingly. In FIG. 6(b), the output from the view field dividing line 47a is also shown because it is observed though faintly. The view field dividing line 47a is created by the edge portion of the view field dividing prism 27a being projected. The marks 41a and 43a, 42a and 44a of the mask are parallel to each other, and the time interval $T_1$ between 41-1 and 43-1, the time interval $T_2$ between 41-2 and 43-2, the time interval $T_3$ between 42-1 and 44-1 and the time interval $T_4$ between 42-2 and 44-2 assume predetermined values. Providing the marks 41a and 42a of the mask so as to be parallel to the marks 43a and 44a, respectively, is useful in that stable measurement can be accomplished even when the scanning beam 48a is vertically displaced as viewed in the figure.

It is important that mark 10a of the mask is provided at an area in which the wafer does not substantially exist and the mark 11a is provided at an area in which the wafer substantially exists. That is, of the various signals in FIG. 6(b), the outputs 43-1, 43-2, 44-1 and 44-2 from the marks 43a and 44a on the mask are unstable due to the interference action with the reflected light from the wafer, while the outputs 41-1, 41-2, 42-1 and 42-2 from the marks 41a and 42a on the mask are very stable without the interference action because the wafer does not substantially exist.

The alignment method for the mask and wafer in the present invention will be described hereinafter.

In the present invention, as the first stage, the mask is scanned by the laser beam in a condition in which the wafer does not actually exist or in a condition in which the light beam is intercepted by a shutter or the like, namely, in a condition in which the wafer does not substantially exist in the optical path, and the time intervals between the marks 41a, 42a and 43a, 44a on the mask are measured and stored in a memory. Since the wafer does not substantially exist, the edge signal outputs 41-1, 41-2, 42-1, 42-2, 43-1, 43-2, 44-1 and 44-2 from the marks 41a, 42a, 43a and 44a on the mask do not fluctuate and the time intervals between the marks are accurately measured.

As the second stage, the wafer is caused to substantially exist under the mask and the mask is scanned by the laser beam. Since the wafer does not exist under the marks 41a and 42a on the mask, the edge signal outputs 41-1, 41-2, 42-1 and 42-2 are still obtained stably.

In the second stage, the edge signal outputs from the alignment marks 43a and 44a on the mask become unstable due to the interference action, and the edge signal outputs 43-1, 43-2, 44-1 and 44-2 are not used for the alignment operation. However, the edge signal outputs 45 and 46 from the alignment marks 45a and 46a of the wafer are obtained stably and these are used for the alignment operation.

The reason why the edge signal outputs from the alignment marks on the wafer are obtained stably even if the mask substantially exists is that, as already described, the reflection factor of the underside of the mask is low and the interference action is weak. The positional deviation of the mask and wafer is detected with the signals of the first and second stages synthesized. That is, in FIG. 6 (b), in the first stage, the time intervals $T_1$, $T_{12}$, $T_2$, $T_3$, $T_{34}$ and $T_4$ are obtained stably and in the second stage, time intervals Ta and Tb are obtained stably. Where completion of the alignment of the mask and wafer is done by the alignment marks 45a and 46a on the wafer being interleaved just intermediately of the alignment marks 43a and 44a on the mask, the wafer may be moved relative to the mask so that the following equations may be established, because the scanning speed of the scanning beam is constant:

$$Ta = \frac{T_1 + T_2 + T_{12}}{2}$$

$$Tb = \frac{T_3 + T_4 + T_{34}}{2}$$

where Ta is the time interval from 41-1 to 45, Tb is the time interval from 42-1 to 46, $T_1$ is the time interval from 41-1 to 43-1, $T_2$ is the time interval from 41-2 to 43-2, $T_{12}$ is the time interval from 41-1 to 41-2, $T_3$ is the time interval from 42-1 to 44-1, $T_4$ is the time interval from 42-2 to 44-2, and $T_{34}$ is the time interval from 42-1 to 42-2.

Now, if the mark 11a (43a, 44a) on the mask is absent, the mark 10a (41a, 42a) on the mask is observed through one objective lens 14a, while the marks 45a and 46a on the wafer are observed through the other objective lens 15a, that is, the marks on the mask and wafer are observed through the different objective lenses, and therefore a perfect positional relation between the mask and the wafer is not guaranteed. In the present invention, however, the mark 11a (43a, 44a) on the mask is used and in the first stage of measurement, this mark on the mask is observed through the objective lens 15a and in the second stage of measurement, the marks 45a and 46a on the wafer are observed through the same objective lens 15a and therefore, even if the objective lens 15a is changed in position relative to the objective lens 14a, a perfect positional relation between the mask and the wafer is guaranteed.

Now, as will be seen from the equations for Ta and Tb, the first alignment mark 11a and the second alignment mark 10a need not be of the same or similar shape.

Figure 7:
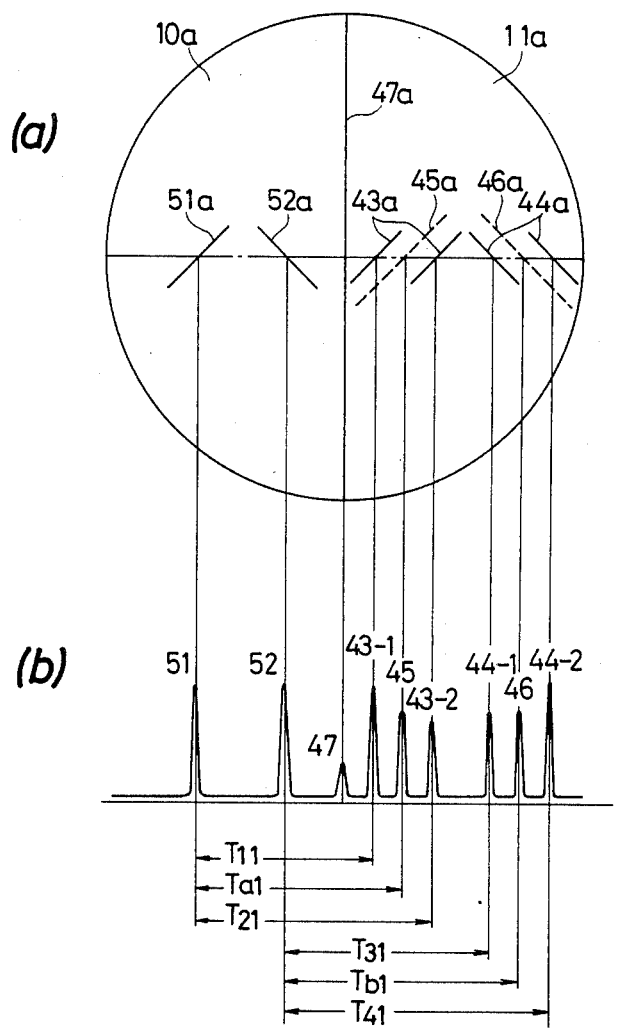
FIG. 7 shows the images of the marks according to another embodiment observed through the alignment scope shown in FIG. 3 and the outputs from the observed images.

That is, as shown, for example, in FIG. 7 (a), the marks 11a and 10a may be marks 51a and 52a in which the marks 41a and 42a are overlapped into a single line. FIG. 7 (b) shows the edge signal outputs of the respective marks in a case where marks 43a, 44a are used as the first alignment mark on the mask and marks 51a, 52a are used as the second alignment mark. The time interval from the output pulse 51 from the alignment mark on the mask in a condition in which the wafer does not substantially exist to 43-1 is indicated as $T_{11}$, the time interval from 51 to 43-2 is indicated as $T_{21}$, the time interval from 52 to 44-1 is indicated as $T_{31}$, and the time interval from 52 to 44-2 is indicated as $T_{41}$. Also, the time intervals between the edge signal outputs 51, 52 from the marks 51a, 52a on the mask in a condition in which the wafer substantially exists and the edge signal outputs 45, 46 from the marks 45a, 46a on the wafer are $Ta_1$ and $Tb_1$. Where alignment of the mask and wafer is completed by the alignment marks 45a and 46a on the wafer being interleaved just intermediately of the alignment marks 43a and 44a on the mask, the wafer is moved relative to the mask so as to satisfy the following equations:

$$Ta_1 = \frac{T_{11} + T_{21}}{2}$$

$$Tb_1 = \frac{T_{31} + T_{41}}{2}$$

Figure 8:
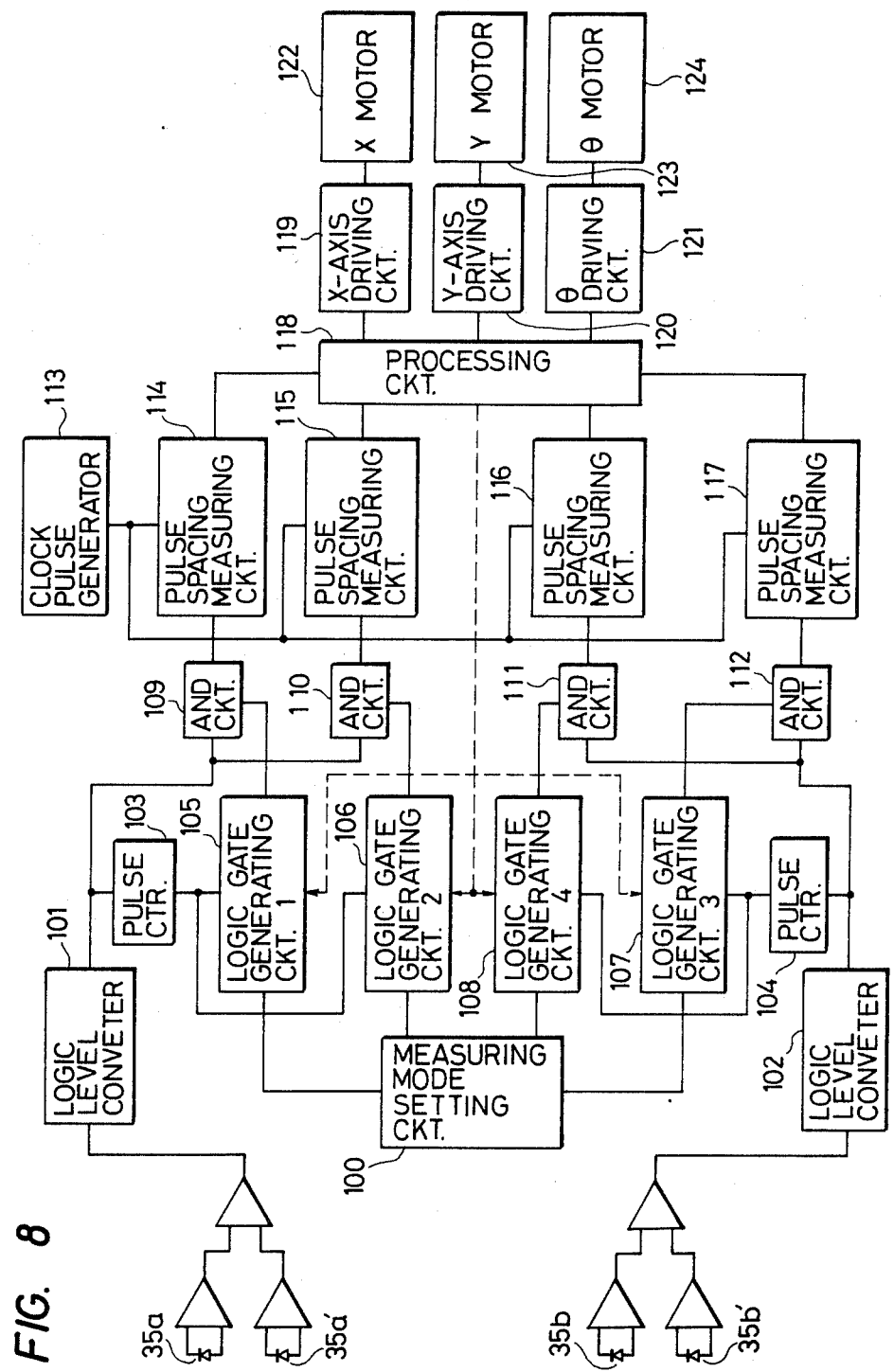
FIG. 8 is a block diagram of a photoelectric detecting system.
Figure 9:
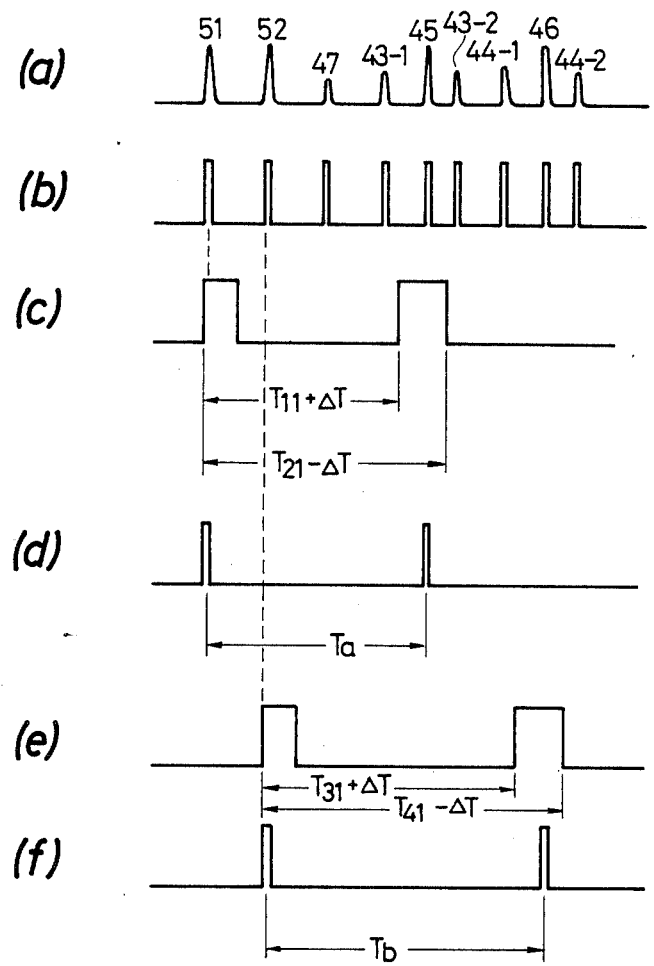
FIG. 9 shows embodiments of the time interval measurement.

A block diagram of the photoelectric detecting system for the apparatus of the invention is shown in FIG. 8, and an embodiment of the time interval measurement is shown in FIG. 9. Referring to FIGS. 8 and 9, description will hereinafter be made chiefly of a second stage of system in which the wafer substantially exists. The system of FIG. 8 includes a measuring mode setting circuit 100, logic level converter circuits 101, 102, pulse counters 103, 104, logic gate generating circuits 1 to 4 105, 106, 107, 108, AND circuits 109, 110, 111, 112, a clock pulse generator 113, pulse spacing measuring circuits 114, 115, 116, 117, a processing circuit 118, an X-axis driving circuit 119, a Y-axis driving circuit 120, a θ driving circuit 121, and X motor 122, a Y motor 123 and a θ motor 124.

The outputs [FIG. 9 (a)] from photodetectors 35a and 35'a are amplified by an amplifier and made into pulses by the logic level converter circuit 101 [FIG. 9 (b)], and selected by the measuring mode setting circuit 100 so as to strike the first pulse or the second pulse, and gate signals are applied through the logic gate generating circuits 1 and 2 [FIG. 9 (c) or (e)]. The time intervals Ta, Tb between the signal from the second alignment mark 51 or 52 of the mask and the signal from the alignment mark 45 or 46 of the wafer are measured through AND circuit [FIG. 9 (d) or (f)], and this data is used to cause X-, Y-, θ-drive so as to satisfy the above-mentioned equations. Now, as regards the first stage measuring system in which the wafer does not substantially exist, a suitable gate signal is selected by the measuring mode setting circuit 100, and the time interval $T_{11}$ between the signals from the alignment marks 51 and 43-1 of the mask and the time interval $T_{21}$ between the signals from 51 and 43-2 are measured, whereby the reference value for the second stage of measurement is formed. The gate signal in FIG. 9 has a pulse width of $2\Delta T$ and, when the alignment mark 45 or 46 of the wafer is interleaved between the alignment marks 43-1 and 43-2 or 44-1 and 44-2 of the mask with a degree of allowance corresponding to $2\Delta T$, an output regarding the wafer may be obtained from the AND circuit.

When the alignment mark of the wafer is not interleaved between the alignment marks of the mask, the output regarding the wafer is not obtained. Of course, it is possible to suitably select the gate signal with such case being taken into account.

FIG. 9 shows signals produced by a simplified embodiment.

It has been described above that as shown in FIG. 5, the marks 41a, 42a on the mask form pairs with the marks 43a, 44a and are scanned by one scanning beam 48a while the marks 41b, 42b form pairs with the marks 43b, 44b and are scanned by the other scanning beam 48b, that is, new marks are provided at two locations, but in principle, the new mark may be provided at least one location.

For example, if the scanning beams 48a and 48b are made common to each other, that is, where the alignment marks 41a, 42a, 43a, 44a, 44b, 43b, 41b and 42b on the mask are successively scanned by a single scanning beam, the alignment marks 41b and 42b may be absent if the alignment marks 41a and 42a are present. Likewise, the alignment marks 41a and 42a may be absent if the alignment marks 41b and 42b are present.

In the present invention, the scanning direction of the beam is not restricted to the shown one, but any scanning direction may be adopted if, as the result of being field-synthesized, the beam can detect the first and second marks of the mask and the marks of the wafer.

Now, various modifications of the present invention would occur to mind.

Figure 10:
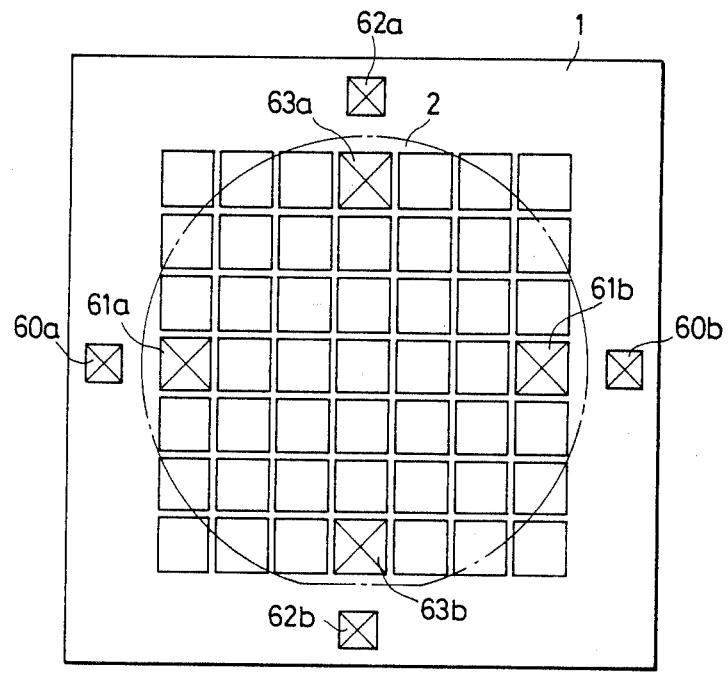
FIGS. 10 to 12 show different embodiments of the alignment marks of the present invention.

The modification shown in FIG. 10 is one in which a pair of objective lenses are disposed not only in the horizontal direction but also in the vertical direction to enhance the accuracy.

The eight locations indicated by crosses on the mask are the locations at which alignment marks are provided. Of these, four locations 60a, 60b, 62a and 62b are within the area in which the wafer 2 does not intervene.

Figure 11:
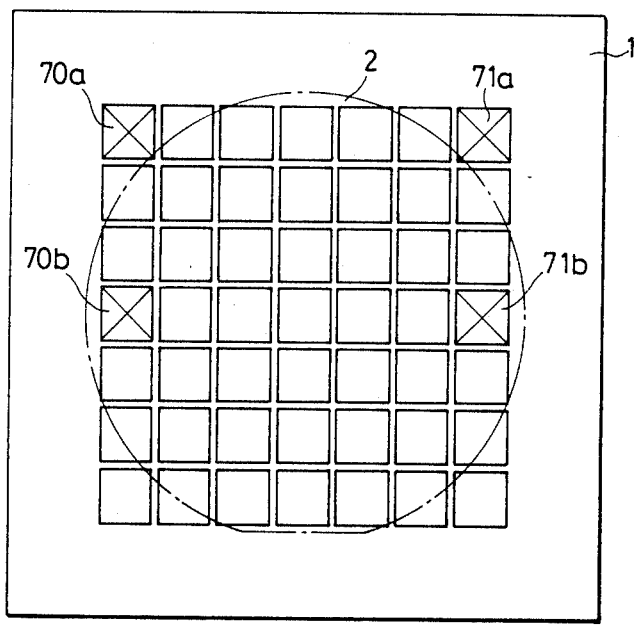

The modifications shown in FIG. 11 is one in which alignment marks on the mask 1 are provided at four locations so as to form a rectangular shape.

Of these, 70a and 71a are within the area in which the wafer 2 does not intervene.

Figure 12:
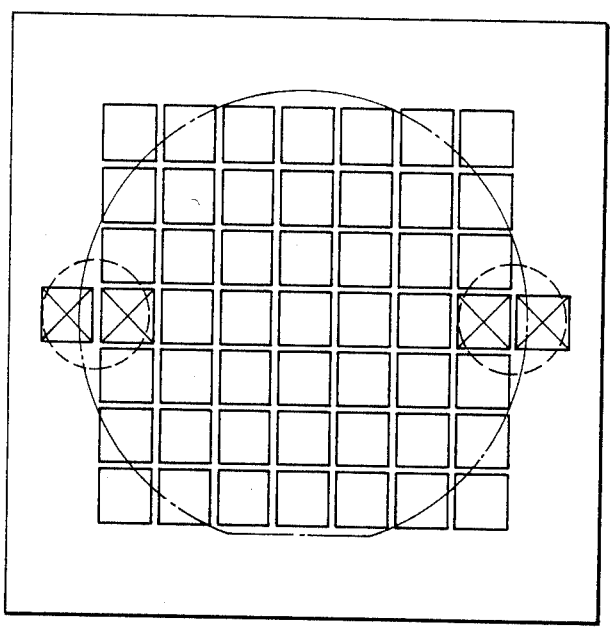

The modification shown in FIG. 12 is an embodiment in which, by skillfully taking the view field of the microscope system as indicated by dotted lines, sufficient detection can be accomplished by two left and right objective lenses.

In this embodiment, however, in the case of the contact method, it is possible to completely focus both the mask and the wafer 2 at one time, while in the case of the proximity method, the presence of a minute gap between the mask and the wafer prevents both the mask and the wafer from being completely focused. In practice, however, the present embodiment is sufficiently applicable to the proximity method.

When the alignment of the mask and wafer is completed, the apparatus shifts to the exposure operation.

Where the position whereat alignment is effected and the position whereat exposure is effected are identical to each other, that is, where the mask and wafer are subjected to exposure at the position whereat the alignment thereof has been completed, it is necessary to retract the objective lens system from the position above the mask to the outside of the optical path so that it may not hinder the exposure. The objective lens system may be designed to return to its original position after the exposure. Alternatively, as shown in FIG. 13, the alignment position A and the exposure position E may be completely separate from each other.

That is, in this case, after the mask and wafer have been aligned by means of objective lenses 14a, 15a, 14b and 15b for alignment, the mask and wafer are fed as a unit to the exposure position E and subjected to exposure while keeping their relative position.

As has hitherto been described, the present invention is characterized in that the mask signal is taken out without being affected by the wafer and this stabilizes the alignment. If the present invention is used, except in the embodiment shown in FIG. 12, microscopic objective lenses are individually provided for the mask and the wafer, respectively, and therefore, the objective lenses can be completely focused to both the mask and the wafer and particularly in the proximity method, mixing of the error resulting from the deviation of the focus is eliminated.

That is, the objective lens provided at the area whereat the wafer does not substantially exist can be set so that it is focused to the mask, and the objective lens provided at the area whereat the wafer substantially exists can be set so that it is focused not to the mask but to the wafer position during printing.

Further, in the present invention, the alignment marks on the mask provided at the area whereat the wafer does not substantially exist are only used as the mere index marks within the alignment scope and do not require the accuracy relative to the actual element pattern or the like and thus, it is also relatively easy to provide the alignment marks. In the present invention, basically, the reference signal may be taken out from any other member than the mask, but particularly, taking out the reference signal from the mask leads to the following result.

When the first stage of measurement terminates in a condition in which the wafer does not substantially exist, whereafter the second stage of measurement is effected in a condition in which the wafer substantially exists, it is conceivable that the absolute position of the mask shifts from the first stage measurement position due to the wafer and mask coming into contact with each other, but in the present invention, the two kinds of alignment marks on the mask, i.e., the second mark which does not overlap the wafer area and the first mark which overlaps the wafer area, shift by the same amount and thus, the wafer can be accurately aligned relative to the shifted mask by the use of the measurement value stored at the first stage. In this case, it is of course desirable that the optical systems for observing the first mark and the second mark therethrough be of the same magnification so that the amounts of shift are equal on the display surface. The minute change of the relative position of the objective lenses 14a and 15a in the alignment scope will be completely corrected if the time interval is measured and stored each time the wafer is subjected to exposure and carried out.

If there is an amount of offset in advance between the mask and the wafer, the time intervals Ta and Tb may be adjusted in accordance with the value thereof. Although, in the present invention, the photoelectric detecting method has been carried out by laser light scanning, of course it is also possible to use other methods such as a method using a photoelectric microscope or an electronic scanning system such as an image pick-up tube or CCD.

In that case, if a detection like the dark view field method is effected by the microscope system particularly on that side on which the signal of the wafer is taken, the contrast will be emphasized and this often is advantageous.

Although, in the present invention, there have been shown only the embodiments in which the actual element is purposely crushed for the autoalignment marks, but if the alignment marks are provided on the scribe line, arrangement of patterns can be efficiently accomplished without the actual element being crushed.

While the present invention has been described with respect chiefly to the contact/proximity method, the invention is also applicable to other printing method such as the projection method using a lens or a mirror.

Also, the method of the present invention is widely applicable not only to the light exposure method but also to other printing exposure methods such as the X-ray exposure method.

What is claimed is:

1. A method for aligning a first body with a second body, the first body being characterized in that light may be transmitted therethrough to the second body and having first and second alignment marks in respective first and second zones thereon, the second body having an alignment mark thereon; said method comprising the steps of:
   carrying out a first observing operation to obtain first electrical signals dependent upon the relative positions of said first and second alignment marks on said first body under first conditions in which there is substantially no influence from any light transmitted through said first body at said first and second zones;
   carrying out a second observing operation, with said alignment mark on said second body aligned with said first zone to obtain second electrical signals dependent upon the relative positions of said second alignment mark on said first body and said alignment mark on said second body, under second conditions in which there is substantially no influence from any light transmitted through said first body at said second zone; and
   utilizing said first and said second electrical signals for bringing said first and said second bodies into a desired positional relationship.

2. A method according to claim 1, wherein said first observing operation is carried out in the absence of said second body thereby to create said first conditions.

3. A method according to claim 2, wherein said first and said second bodies are so constructed that when said alignment mark on said second body is aligned with said first zone, said second body does not extend to a region aligned with said second zone on said first body, thereby to create said second conditions.

4. A method according to claim 1, wherein said observing operations are carried out by a scanning light beam.

5. A method according to claim 1, wherein gating is performed, in response to said first signals, during the obtaining of said second signals.

6. A method according to claim 5, wherein said first and said second electrical signals comprise pulses, obtained in response to detection of said alignment marks, on said first and said second bodies during said first and said second observing operations and wherein time periods between pulses obtained during said first observing operation and between pulses obtained during said second observing operation are measured and utilized for bringing said bodies into the desired positional relationship.

7. A method according to claim 6, wherein said gating is performed during said second observing operation to permit the production of a pulse produced by reflection of light by said alignment mark on said second body and to eliminate pulses produced by reflection of light from said first alignment mark on said first body.

8. Apparatus for aligning a first body with a second said body, said first body being characterized in that light may be transmitted therethrough to the second body, said first body having a first and second alignment marks in respective first and second zones thereon, said second body having an alignment mark thereon; said apparatus comprising:
   observing means for observing the regions of said first and second zones on said first body;
   obtaining means for obtaining, in response to a first observing operation through said observing means carried out under first conditions in which there is substantially no influence from any light transmitted through said first body at said first and second zones, first electrical signals dependent upon the relative positions of said first and said second alignment marks on said first body; and for obtaining, in response to a second observing operation through said observing means carried out with said alignment mark on said second body aligned with said first zone and under second conditions in which there is substantially no influence from any light transmitted through said first body at said second zone, second electrical signals dependent upon the relative position of said second alignment mark on said first body and said alignment mark on said second body; and
   means for bringing said first and said second bodies into a desired positional relationship utilizing said first and said second electrical signals.

9. Apparatus according to claim 8, wherein said observing means comprises means for forming a light beam and means for causing said light beam to scan said first and second bodies.

10. Apparatus according to claim 8, wherein said obtaining means is operable to derive a gating signal from said first electrical signals and to obtain said second electrical signals with the aid of said gating signal.

11. Apparatus according to claim 10, wherein said obtaining means obtains said first and said second electrical signals as pulses obtained in response to detection of said alignment marks during said observing operations, wherein said apparatus further comprises means for measuring time periods between said pulses obtained during said first observing operation and between said pulses obtained during said second observing operation, and whether said means for bringing said first and said second bodies into a desired positional relationship utilizes said time periods.

12. Apparatus according to claim 11, wherein said obtaining means is operable to produce said gating signal during said second observing operation so as to permit the production of a pulse in response to detection of light reflected from said alignment mark on said second body while eliminating pulses produced in response to detection of light reflected from said first alignment mark on said first body.

13. Apparatus according to claim 8, wherein said observing means includes first and second objective lenses for observing said first and second zones of said body respectfully.

* * * * *